(12) United States Patent
Salama et al.

(10) Patent No.: US 8,762,114 B2
(45) Date of Patent: Jun. 24, 2014

(54) FRACTIONAL ORDER ELEMENT BASED IMPEDANCE MATCHING

(75) Inventors: Khaled N. Salama, Thuwal (SA); Ahmed Gomaa Ahmed Radwan, Thuwal (SA); Atif Shamim, Thuwal (SA)

(73) Assignee: King Abdullah University of Science and Technology, Thuwal (SA)

( * ) Notice: Subject to any disclaimer, the term of this patent is extended or adjusted under 35 U.S.C. 154(b) by 224 days.

(21) Appl. No.: 13/288,135

(22) Filed: Nov. 3, 2011

(65) Prior Publication Data
US 2012/0123750 A1     May 17, 2012

Related U.S. Application Data

(60) Provisional application No. 61/412,687, filed on Nov. 11, 2010.

(51) Int. Cl.
    *G06F 7/60*          (2006.01)

(52) U.S. Cl.
USPC .................................................. 703/2

(58) Field of Classification Search
None
See application file for complete search history.

(56) References Cited

U.S. PATENT DOCUMENTS

| | | | |
|---|---|---|---|
| 5,079,507 A | 1/1992 | Ishida et al. | |
| 5,866,985 A * | 2/1999 | Coultas et al. | 315/111.21 |
| 5,939,953 A * | 8/1999 | Yogo et al. | 333/17.3 |
| 6,192,318 B1 * | 2/2001 | Yogo et al. | 702/65 |
| 6,674,293 B1 * | 1/2004 | Tsironis | 324/638 |
| 2004/0128629 A1 | 7/2004 | Chen et al. | |
| 2009/0175378 A1 | 7/2009 | Staszewski et al. | |

OTHER PUBLICATIONS

International Search Report and Written Opinion in International Application No. PCT/IB11/02944 mailed May 25, 2012 7 pages.

* cited by examiner

*Primary Examiner* — Omar Fernandez Rivas
*Assistant Examiner* — Nithya J Moll
(74) *Attorney, Agent, or Firm* — Thomas | Horstemeyer, LLP

(57) ABSTRACT

Disclosed are various embodiments of methods and systems related to fractional order element based impedance matching. In one embodiment, a method includes aligning a traditional Smith chart ($|\alpha|=1$) with a fractional order Smith chart ($|\alpha|\neq1$). A load impedance is located on the traditional Smith chart and projected onto the fractional order Smith chart. A fractional order matching element is determined by transitioning along a matching circle of the fractional order Smith chart based at least in part upon characteristic line impedance. In another embodiment, a system includes a fractional order impedance matching application executed in a computing device. The fractional order impedance matching application includes logic that obtains a first set of Smith chart coordinates at a first order, determines a second set of Smith chart coordinates at a second order, and determines a fractional order matching element from the second set of Smith chart coordinates.

20 Claims, 17 Drawing Sheets

(a)

(b)

| $Z_L$ | | 100−50j | 30+20j | 10+40j | −50+100j |
|---|---|---|---|---|---|
| Region | | I | II | III | IV |
| Fig. 1(a) Conventional | X (Ω) | 61.23 −61.23 | No Solution | 77.45 −77.45 | No Solution |
| | B (Ω)⁻¹ | 0.0058 −0.0138 | No Solution | 0.0326 0.0144 | No Solution |
| Fig. 1(b) Conventional | X (Ω) | No Solution | 4.495 −44.495 | −20 −60 | No Solution |
| | B (Ω)⁻¹ | No Solution | 0.0163 −0.0163 | 0.04 −0.04 | No Solution |
| Fig. 4(a) Fractional | α | 1.5 | −0.5 | −0.5 | −0.5 |
| | $|Z_f|$ (Ω) | 50√2 | 20√2 | 40√2 | 100√2 |

(a)

(b)

(a)

(b)

(a)

(b)

FRACTIONAL ORDER ELEMENT BASED IMPEDANCE MATCHING

CROSS REFERENCE TO RELATED APPLICATIONS

This application claims priority to U.S. provisional application entitled "FRACTIONAL ORDER ELEMENTS BASED IMPEDANCE MATCHING NETWORKS AND METHODS FOR DESIGNING THE SAME" having Ser. No. 61/412,687, filed Nov. 11, 2010, which is entirely incorporated herein by reference as if fully set forth herein.

BACKGROUND

Impedance matching has been an important aspect in radio frequency (RF) and microwave designs. Appropriate impedance matching provides for maximum power transfer to the load, improving the signal-to-noise ratio of the sensitive receiver components, and reducing the amplitude and phase errors for power distribution networks. The simplest approach for impedance matching is through the use of matching networks based on a combination of resistance and reactive elements (inductor or capacitor).

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Figure 1:
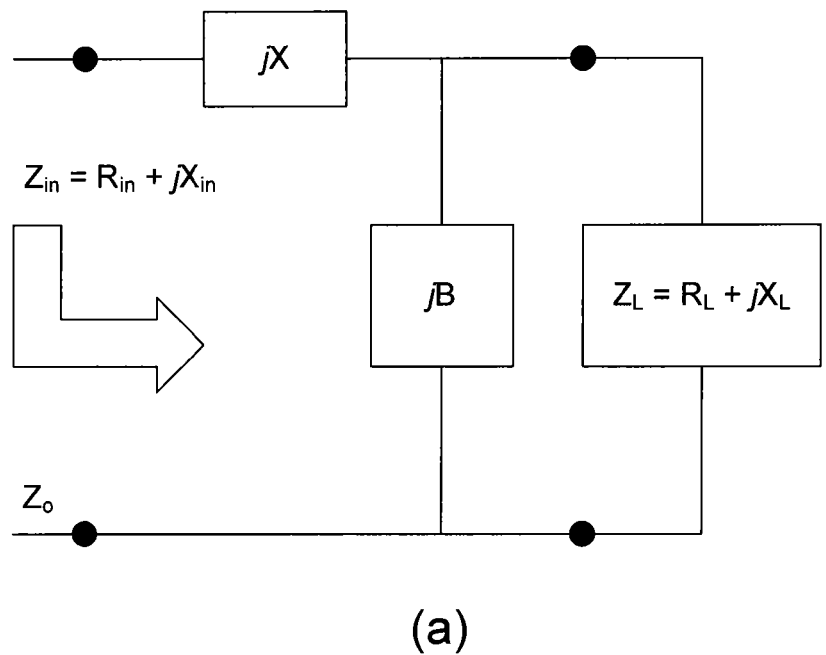
FIGS. 1(a) and 1(b) are schematic diagrams illustrating examples of conventional L-section matching networks.
Figure 1:
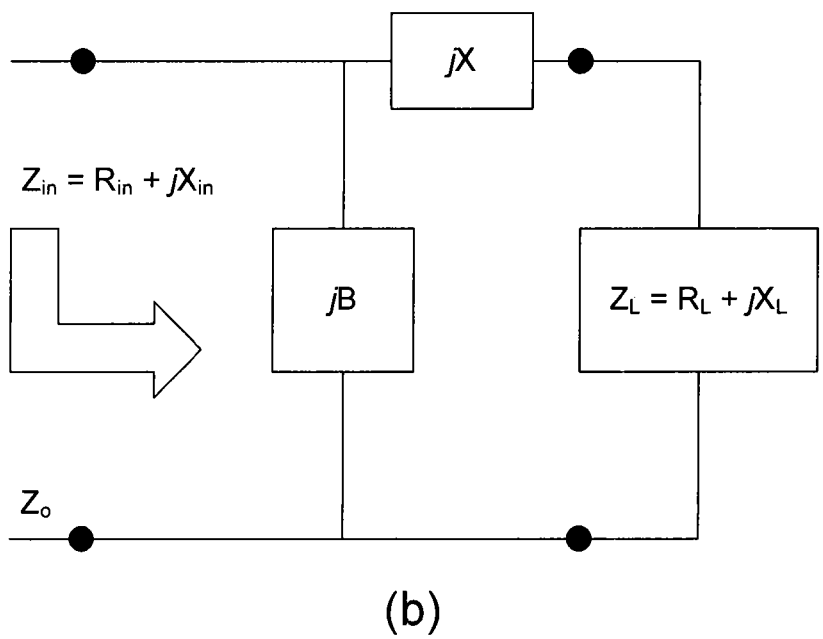

Disclosed herein are various embodiments of methods and systems related to fractional order element based impedance matching. Reference will now be made in detail to the description of the embodiments as illustrated in the drawings, wherein like reference numbers indicate like parts throughout the several views.

Fractional order circuit elements concept has opened the doors to numerous applications with exceptional performance, which were not achievable for the integer order standard circuit elements like inductors and capacitors. In contrast to these conventional elements, a fractional element is a function of the parameter value (C or L) and the fractional order $\alpha$, which brings in immense freedom and versatility towards design and applications. The concept of fractional order elements has already found its utility in applications of electromagnetics, mechanics, signal processing, bioengineering, agriculture and control.

The concept of fractional circuit elements originated from fractional calculus and remained theoretical for quite some time. However, recently a number of practical realizations have been demonstrated for a two port fractional element. Lumped (RC circuit) and chemical based realizations with experimental results have been demonstrated for a half order ($\alpha=-0.5$) fractional capacitor, whereas on-chip distributed (Tree and Hilbert type) implementations for the same have been shown. These practical realizations of $|\alpha|=0.5$ indicate that fractional order circuit elements will be commonly used in commercial products in, e.g., radio frequency (RF) and microwave applications.

With reference to FIGS. 1(a) and 1(b), shown are schematic diagrams illustrating examples of conventional L-section matching networks. A complex load ($Z_L=R_L+jX_L$) can be matched to a transmission line of characteristic impedance $Z_o$, if the real part ($R_{in}$) of the matching network input impedance $Z_{in}$ matches $Z_o$, while the imaginary part is zero. This means that two degrees of freedom are provided by the matching network. Typically, an L-section lumped element matching network is used for this purpose, as shown in FIGS. 1(a) and 1(b). The circuit in FIG. 1(a) is generally used for $R_L>Z_o$ and the circuit in FIG. 1(b) is suitable for cases where $R_L < Z_o$. The reactance X and susceptance B may either be positive or negative, representing an inductor or capacitor for X and a capacitor or inductor for B. The Smith chart has been an important graphical tool for impedance matching. Unfortunately, traditional Smith charts cannot be used for design using fractional order elements. However, the traditional Smith chart is only a special case of a more generalized fractional order Smith chart.

A fractional element is one whose impedance is proportional to $s^\alpha$ as given by:

$$Z_f = |Z_f|\{\cos(0.5\pi|\alpha|) \pm j \sin(0.5\pi|\alpha|)\} \qquad \text{EQN. (1)}$$

where $\alpha$ is the fractional order of the element and $|Z_f|$ is the magnitude of fractional impedance. The phase difference between the voltage across its two terminals and the current entering these terminals is $\alpha\pi/2$. The range for $\alpha$ is $(-2, 2)$, where the negative range $(-2, 0)$ represents a fractional capacitor of order $\alpha_{cap}$ and the positive range $(0, 2)$ represents a fractional inductor of order $\alpha_{ind}$. From EQN. (1), it can be seen that the conventional integer-based resistor, inductor, and capacitor network used at present are only special cases of fractional based elements and correspond to $\alpha=0$, 1, and 1 respectively.

The phase of a fractional element can be controlled through $\pi$. For example, a phase of 45° can be achieved with $\alpha=0.5$ order capacitor or inductor whereas conventional elements are restricted to a phase of 90°.

The magnitude of the fractional element impedance ($|Z_f|$) is related to the frequency in a non-linear fashion ($|Z_f| = \omega^{|\alpha|} L$) and ($|Z_f| = 1/(\omega^{|\alpha|} C)$) for a fractional order inductor and capacitor, respectively. This means that by choosing the right $\alpha$, the effect of frequency can either be enhanced or reduced depending on the requirements of the application.

The impedance of the fractional element, unlike conventional resistive and reactive elements, has a real part in addition to the imaginary part and both of them are frequency dependent as shown in EQN. (1). Unlike the conventional case, a fractional element has additional control through $\alpha$. This means that a single fractional element can provide the two degrees of freedom provided by the typical two-reactive element based matching networks.

Referring now to FIGS. 2(a) and 2(b), shown are examples of a traditional Smith chart 200 ($|\alpha|=1$) and a fractional order Smith chart 210 ($|\alpha|\neq 1$). Beginning with the traditional Smith chart 200 of FIG. 2(a), consider a complex load impedance $Z_L$ on the unity (matching) circle 203 at point A. In order to move $Z_L$ on the unity (matching) circle 203, either a fractional inductor with order $\alpha_{ind}$ (for clockwise movement to point B) or a fractional capacitor with order $\alpha_{cap}$ (for anticlockwise movement to point M) may be employed. The phase for the former is $\alpha_{ind}\pi/2$ while for the latter it is $\alpha_{cap}\pi/2$ and the phase difference between the two is $\pi$.

$$\alpha_{ind}\frac{\pi}{2} - \alpha_{cap}\frac{\pi}{2} = \pi \Rightarrow \alpha_{ind} - \alpha_{cap} = 2 \qquad \text{EQN. (2)}$$

From EQN. (2), it can be seen that the Smith chart circles 203 (resistance and reactance) are actually pairs of completely identical circles. They appear to be single for the traditional case ($\alpha=1$), where the identical circles completely overlap each other. This fact becomes very clear in the fractional order case ($\alpha\neq 1$) where the fractional order Smith chart circles 213 and 216 are separated from each other, as shown in FIG. 2(b). Interestingly, any circle with order $\alpha_{ind}$ is completed by its counterpart circle of order $\alpha_{cap}$. For example, the $\alpha_{ind}=1.5$ circle 213 in the upper half of the fractional order Smith chart 210 is completed by $\alpha_{cap}=-0.5$ circle 216 in the lower half of the fractional order Smith chart 210 and vice versa to satisfy EQN. (2).

If $Z_L$ in the traditional case of FIG. 2(a) is to be matched to the characteristic impedance $Z_o$ represented as point M, a matching capacitor with order $\alpha_{cap}=-1$ can be employed. The same impedance matching process can be repeated for the fractional case, where for example $Z_L$ is located at the $\alpha_{ind}=1.5$ circle 213, shown as point D in FIG. 2(b). A fractional capacitor will move $Z_L$ to the matching point M. However, the fractional order of this matching capacitor will be $\alpha_{cap}=-0.5$, to satisfy the condition in EQN. (2).

Figure 3:
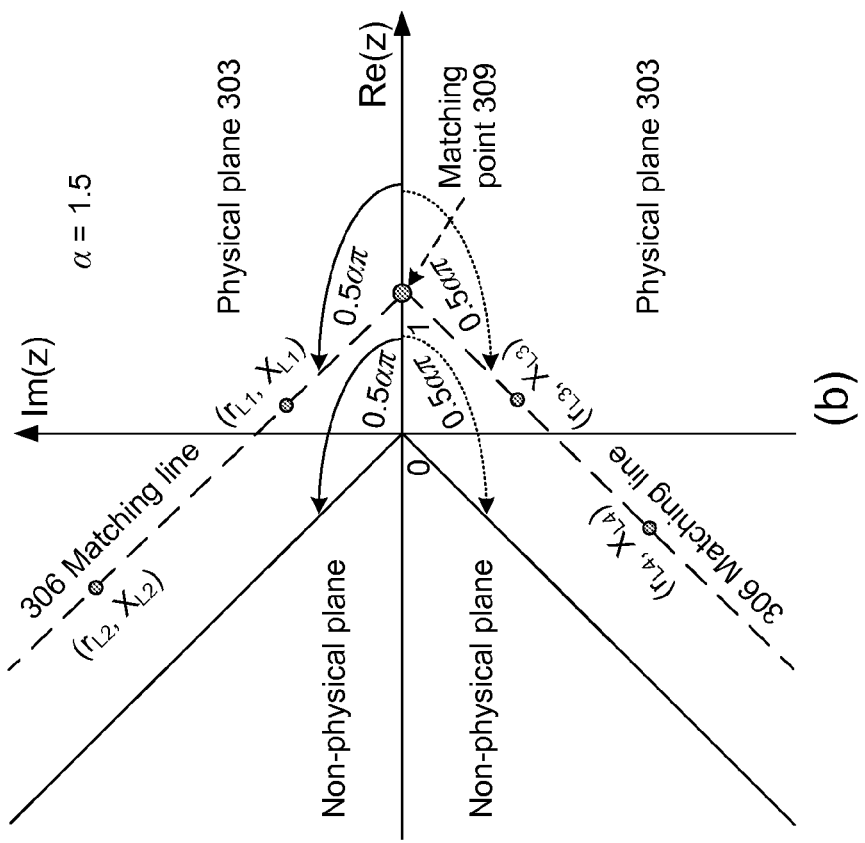
FIGS. 3(a) and 3(b) are a graphical illustration of load impedance mapping of fractional orders of FIG. 2(b) in accordance with various embodiments of the present disclosure.
Figure 3:
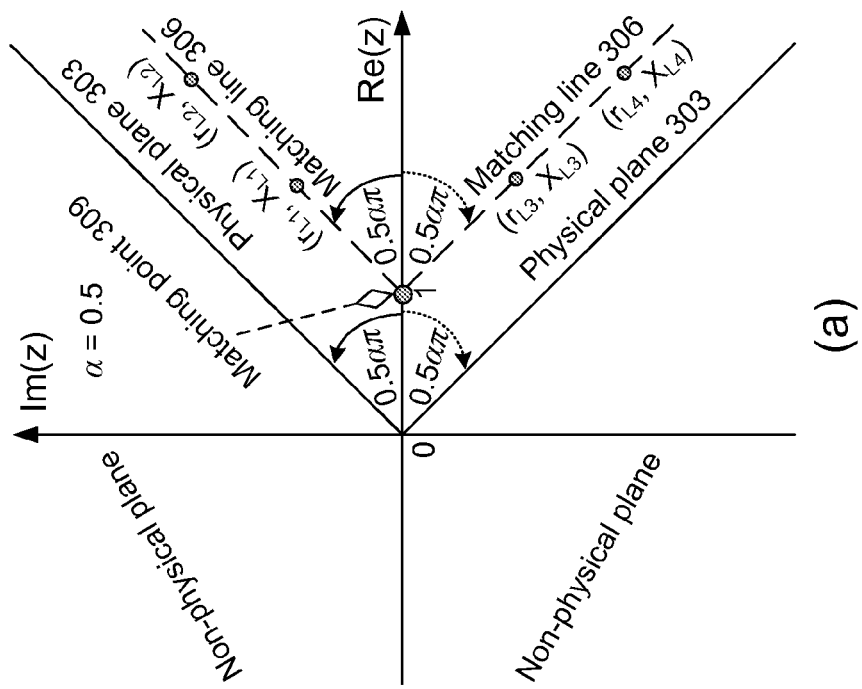

A series matching element is preferred over its parallel counterpart because of the ease of its realization. The concept of series fractional element matching can be elaborated by a graphical illustration of the load impedance mapping, as shown in FIGS. 3(a) and 3(b). Any normalized complex impedance $z=r+jx$ can be mapped on a fractional order Smith chart provided it satisfies the condition that Argument (z) does not exceed the boundaries of $\pm\alpha\pi/2$. For example, the area labeled as the physical plane 303 in FIG. 3(a) is for all the normalized impedances, which can be mapped for $|\alpha|=0.5$. It can be seen from FIG. 3(a) that the matching line 306, passing through the matching point 309 at an angle $|\alpha|\pi/2$, is parallel to the boundary of the physical plane. All the load impedances $[(r_1,x_1), (r_2,x_2), \ldots (r_N,x_N)]$ lying on this matching line 306 can be matched to the characteristic impedance $Z_o$ through $\alpha$ and corresponding $|Z_f|$. If $Z_o$ is a pure real impedance, ($Z_o=R_o$), the loci of all load impedances that can be matched to $Z_o$ for a particular $\alpha$, satisfy the condition:

$$x_L = (r_L - 1)\tan(0.5\pi\alpha). \qquad \text{EQN. (3)}$$

Interestingly, as $|\alpha|$ increases, the span for mapping complex impedance increases, as shown in the physical plane for $|\alpha|=1.5$ in FIG. 3(b). Contrary to the traditional case, negative resistances can also be mapped and matched with the help of fractional elements as illustrated in FIG. 3(b).

Referring to FIGS. 4(a) and 4(b), shown are schematic and graphical illustrations of fractional impedance matching with a series fractional element 400. Let us consider a normalized complex load impedance $z_L$ that is to be matched through the series fractional element 400 of normalized impedance $z_f$ to a transmission line of characteristic impedance $Z_o$, as shown in FIG. 4(a). The matching can be done graphically, as shown in FIG. 4(b). First of all $z_L$ is plotted, and then a vector 403 is drawn from the origin (indicated as 0) to the $z_L$ point 406 (indicated as $r_L$, $x_L$). The matching line 409 is now drawn as a resultant vector through $z_L$ 406 and the matching point 412. The length of this resultant vector 409 is equal to the $|z_f|$ required for matching the impedance. The $\alpha_{ind}$ is obtained from the $\alpha_{ind}\pi/2$ angle 415, created between the resultant vector 409 and the Re(z) line 418, whereas $\alpha_{cap}$ is obtained from the $-\alpha_{cap}\pi/2$ angle 421 between the resultant vector 409 and the horizontal line 424 of FIG. 4(b).

Analytically, $\alpha_{ind}$, $\alpha_{cap}$, and $|z_f|$ can be found to match any complex impedance from $$|z_f| = \sqrt{(1-r_L)^2 + (x_L)^2} \qquad \text{EQN. (4)}$$

$$\alpha_{ind} = 2 + \alpha_{cap} = \frac{\pi}{2}\cos^{-1}\left(\frac{1-r_L}{|z_f|}\right) \qquad \text{EQN. (5)}$$

For example, in order to match a normalized load impedance $z_L=0.2+j0.8$, a fractional capacitor of order $\alpha_{cap}=-0.5$ and $|z_f|=0.8\sqrt{2}$ can be utilized.

After establishing the fact that single fractional element impedance matching is feasible, the concept was compared in performance with the conventional matching networks shown in FIGS. 1(*a*) and 1(*b*). A few test load impedance cases are selected and matched with both the conventional and fractional matching networks. The results are summarized in the table of FIG. 5. By comparing the conventional element solutions associated with FIGS. 1(*a*) and 1(*b*) to the fractional element solution of FIG. 4(*a*), it can be seen that the conventional solutions not only require two elements but are also limited in the extent of impedances that may be matched. This fact is elaborated in FIG. 6(*a*), where it is shown that the different combinations of conventional solutions can match impedances either in the region I or in the regions II and III. However, no one solution can cover the whole range of impedances including region IV. On the contrary, a single series fractional element can match any complex impedance in all the four regions, including the negative resistance region IV that is important for microwave applications.

Figures 5, 6:
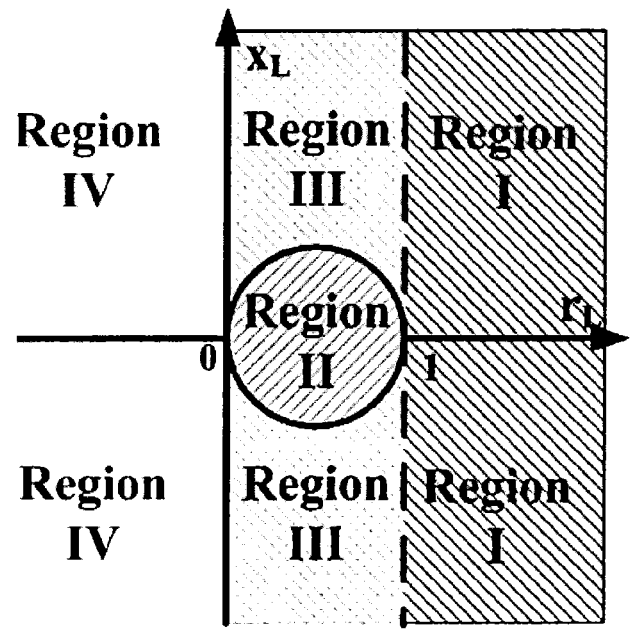
FIG. 5 is a table comparing examples of conventional element solutions associated with FIGS. 1(a) and 1(b) to a fractional element solution associated with FIG. 4(a) in accordance with various embodiments of the present disclosure.
Figure 6:
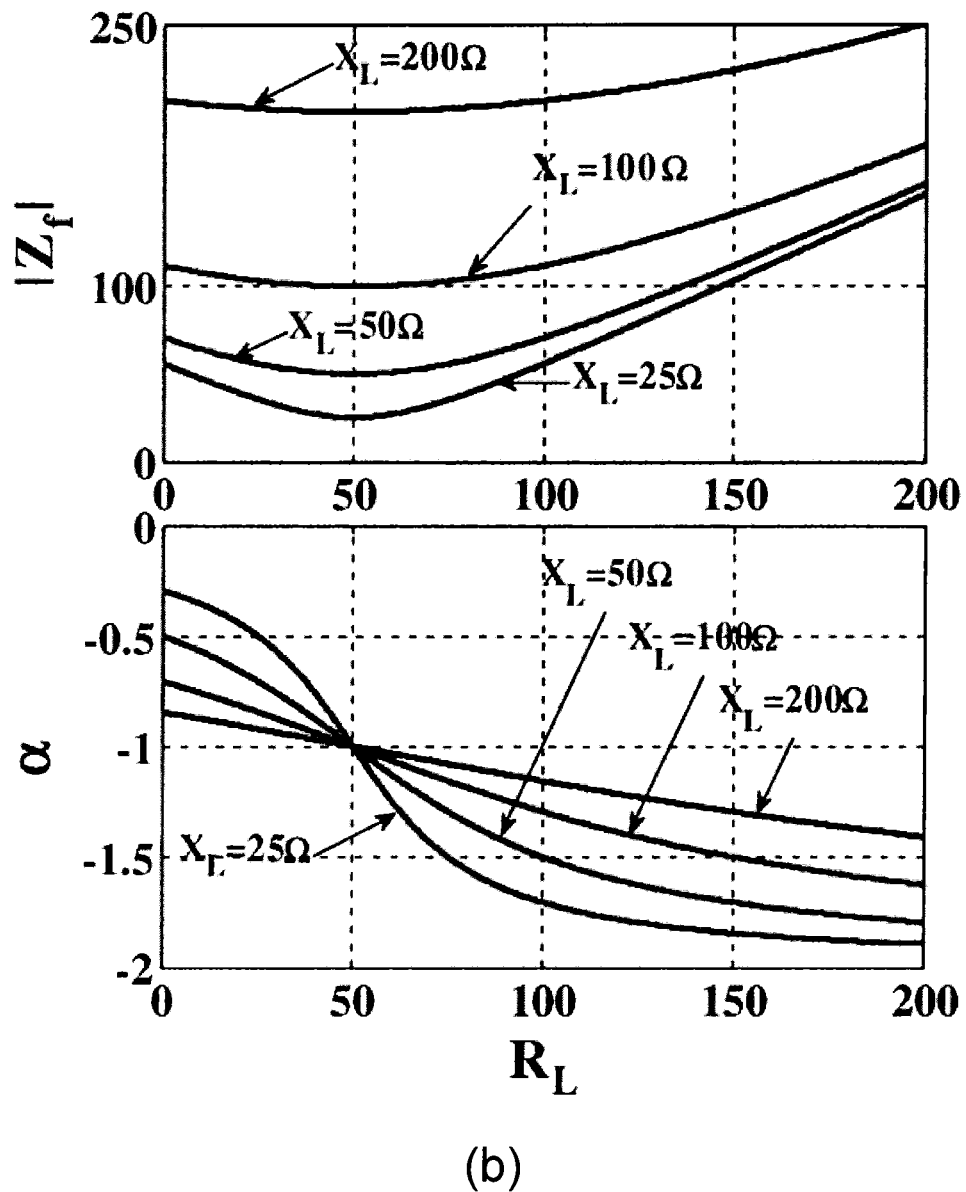
FIGS. 6(a) and 6(b) are diagrams illustrating load impedance matching regions and fractional matching values in accordance with various embodiments of the present disclosure.

FIG. 6(*b*) demonstrates the impedance magnitudes $|z_f|$ and orders a of various series fractional elements used to match the typical range of complex impedances. It should be noted that for load impedances $R_L<50\Omega$ and $X_L<100\Omega$, values of $|z_f|<125\Omega$ and $|\alpha|<1$ can provide the desired matching. Although not shown in FIG. 6(*b*), for other load impedances $R_L>50\Omega$ and $X_L>100\Omega$, a parallel fractional element can provide the required matching for $|\alpha|<1$ and $|z_f|<100\Omega$.

Figure 2:
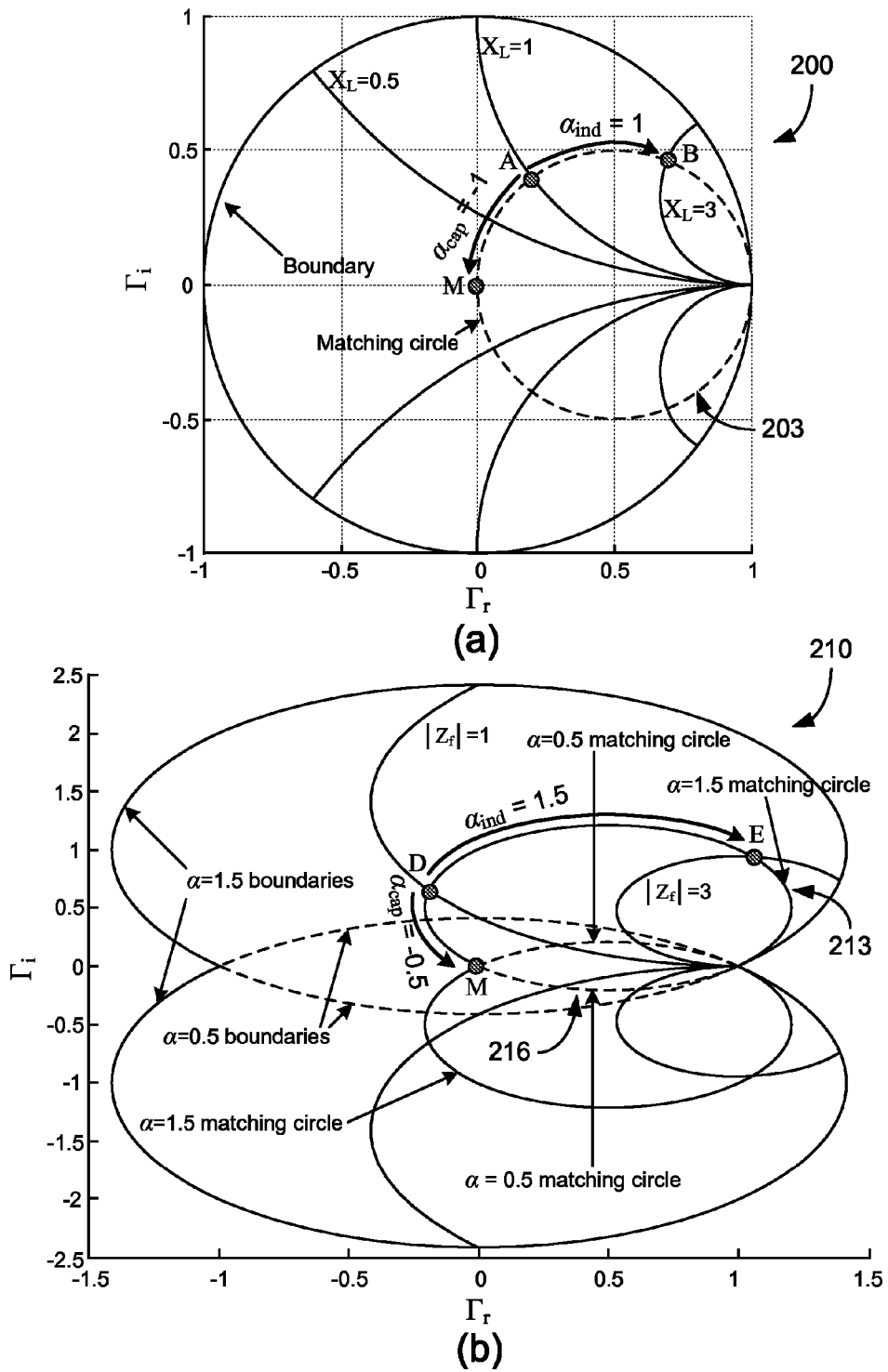
FIGS. 2(a) and 2(b) are examples of a traditional Smith chart ($|\alpha|=1$) and a fractional order Smith chart ($|\alpha|\neq 1$) in accordance with various embodiments of the present disclosure.

The traditional Smith chart 200 ($|\alpha|=1$) of FIG. 2(*a*) is a widely used graphical tool to solve complex transmission line and impedance matching problems. Basically, it is a polar plot of the voltage reflection coefficient $\Gamma=\Gamma_r+j\Gamma_i$, where the magnitude $|\Gamma|$ is plotted as a radius ($|\Gamma|<1$) from the centre (0,0) and the angle θ ($-180°\leq\theta\leq180°$) is measured from the right hand side of the horizontal diameter. However, the traditional Smith chart may be generalized to analyze the fractional order elements.

Figure 7:
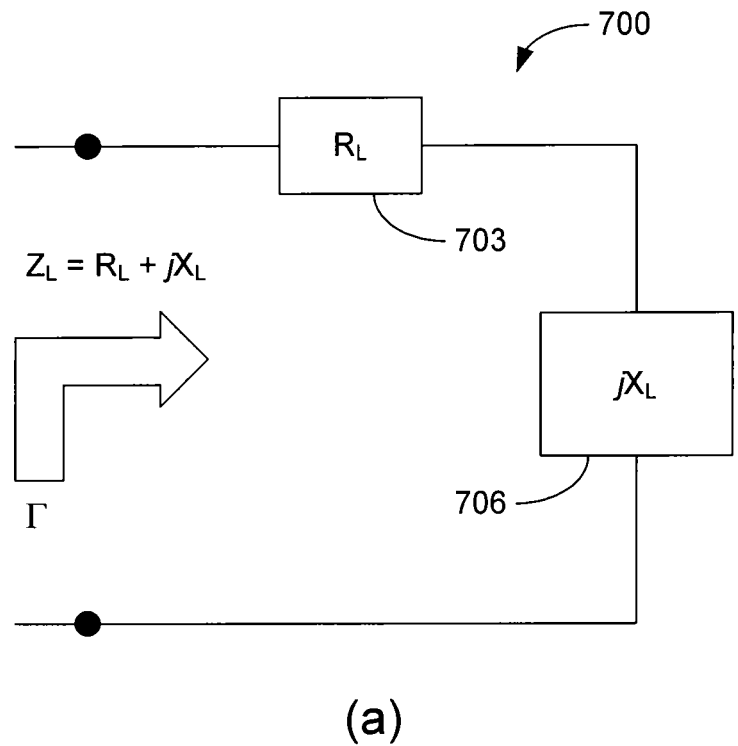
FIGS. 7(a) and 7(b) are schematic diagrams illustrating examples of a conventional load impedance and a load impedance including a fractional element in accordance with various embodiments of the present disclosure.
Figure 7:
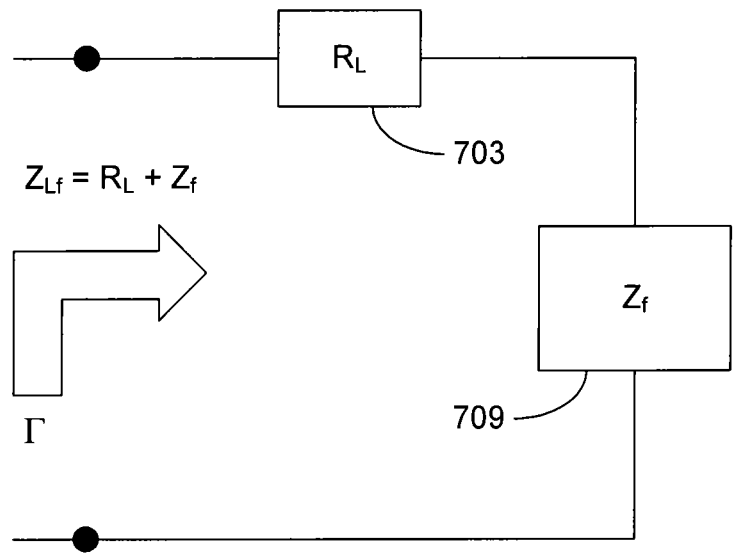

Referring now to FIGS. 7(*a*) and 7(*b*), shown are schematic diagrams illustrating examples of a conventional load impedance and a load impedance including a fractional element, respectively. Consider a lossless line of characteristic impedance $Z_o$ terminated in a complex load $Z_L=R_L+jX_L$, as shown in FIG. 7(*a*), where $R_L$ 703 is the resistance of the circuit 700 and $X_L$ 706 is the reactance or impedance of the reactive element. For this line, Γ in terms of the normalized load impedance $z_L=r_L+jx_L$ (where $z_L=Z_L/Z_o$) may be represented by the traditional Smith chart coordinates $P_L=(r_L,x_L)$, is given by:

$$\Gamma = \frac{(z_L - 1)}{(z_L + 1)} \quad \text{EQN. (6)}$$

However, if the reactive element 706 in the complex load is replaced by a fractional element 709 as shown in FIG. 7(*b*), then from EQN (1) the normalized fractional load impedance $z_{Lf}$, represented by Smith chart coordinates $P\alpha=(r_L, |z_f|)$ is given by:

$$z_{Lf}=r_L+|z_f|\{\cos(0.5\pi|\alpha_L|)\pm j\sin(0.5\pi|\alpha_L|)\} \quad \text{EQN. (7)}$$

$$z_{Lf(real)}=r_L+|z_f|\cos(0.5\pi|\alpha|) \quad \text{EQN. (8)}$$

The real part of the fractional load impedance in EQN. (4) is different from the real part of the traditional load impedance, where the latter is equal to the resistance $r_L$ in the circuit. Inserting EQN. (7) into EQN. (6) and equating the real and imaginary parts, results in:

$$\left(\Gamma_r - \frac{r_L}{r_L+1}\right)^2 + \left(\Gamma_i \pm \frac{\cos(0.5\pi|\alpha|)}{(r_L+1)\sin(0.5\pi|\alpha|)}\right)^2 = \left(\frac{1}{(r_L+1)\sin(0.5\pi|\alpha|)}\right)^2 \quad \text{EQN. (9)}$$

for constant $r_L$ circles, and $$(\Gamma_r - 1)^2 + \left(\Gamma_i \mp \frac{1}{|z_f|\sin(0.5\pi|\alpha|)}\right)^2 = \left(\frac{1}{|z_f|\sin(0.5\pi|\alpha|)}\right)^2 \quad \text{EQN. (10)}$$

for constant $|z_f|$ circles. Note that $\Gamma_i>0$ corresponds to inductive circles and $\Gamma_i<0$ corresponds to capacitive circles.

Figure 8:
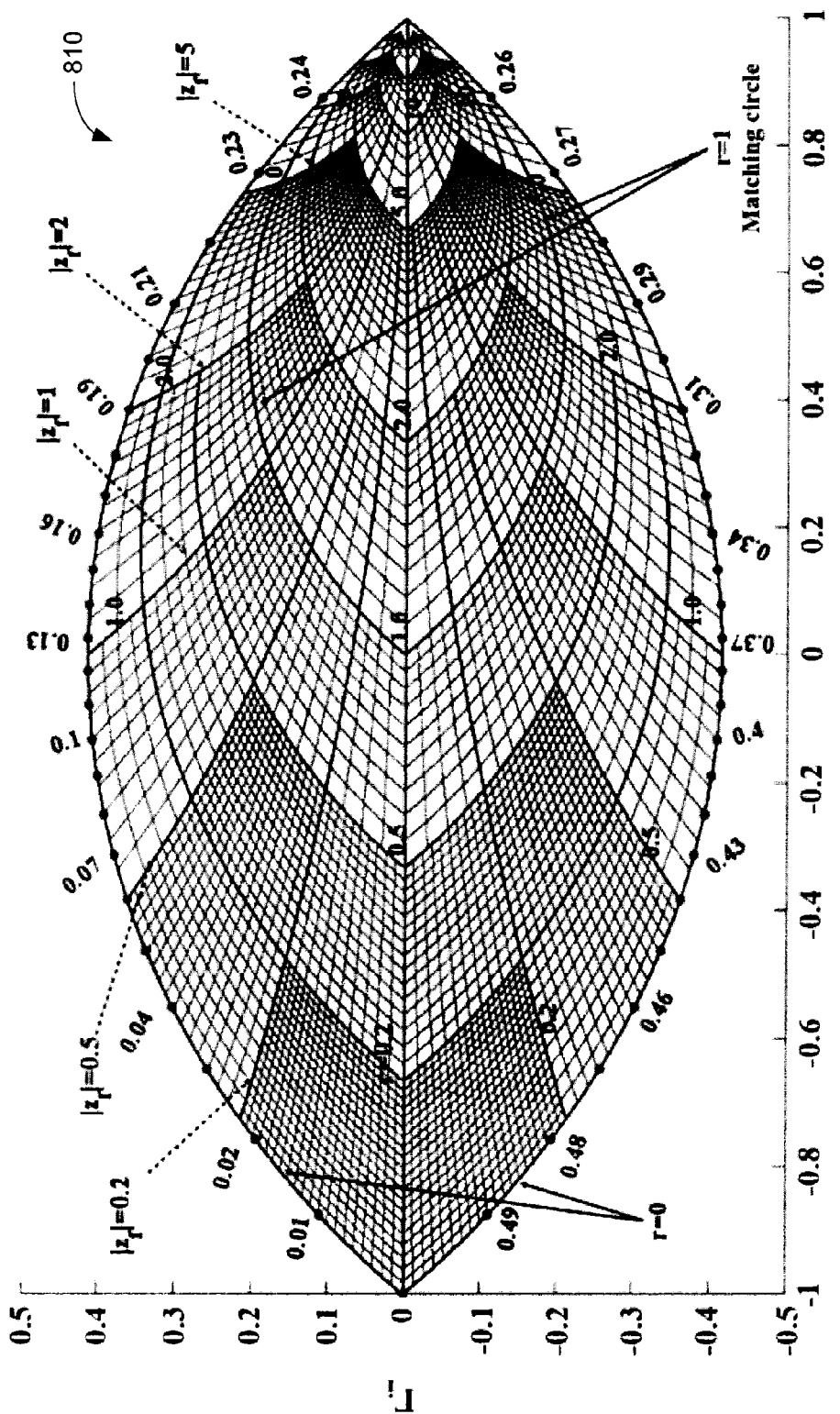
FIG. 8 is an example of a resultant fractional order Smith chart in accordance with various embodiments of the present disclosure.

Referring now to FIG. 8, shown is an example of a resultant fractional order Smith chart 810 for $|\alpha|=0.5$ (both fractional inductors and capacitors). The effect of $|\alpha|=0.5$ can be clearly seen in FIG. 8, where the fractional order Smith chart 810 now resembles an elliptical-like shape and $|\Gamma_i|$ is limited to values less than ±0.4143. From EQN. (9), it can be seen that the constant resistance circles always pass through the $\Gamma_r=1$ and $\Gamma_i=0$ point. For the special case of $|\alpha|=1$, EQNS. (9) and (10) reduce to the traditional Smith chart equations.

Figure 9:
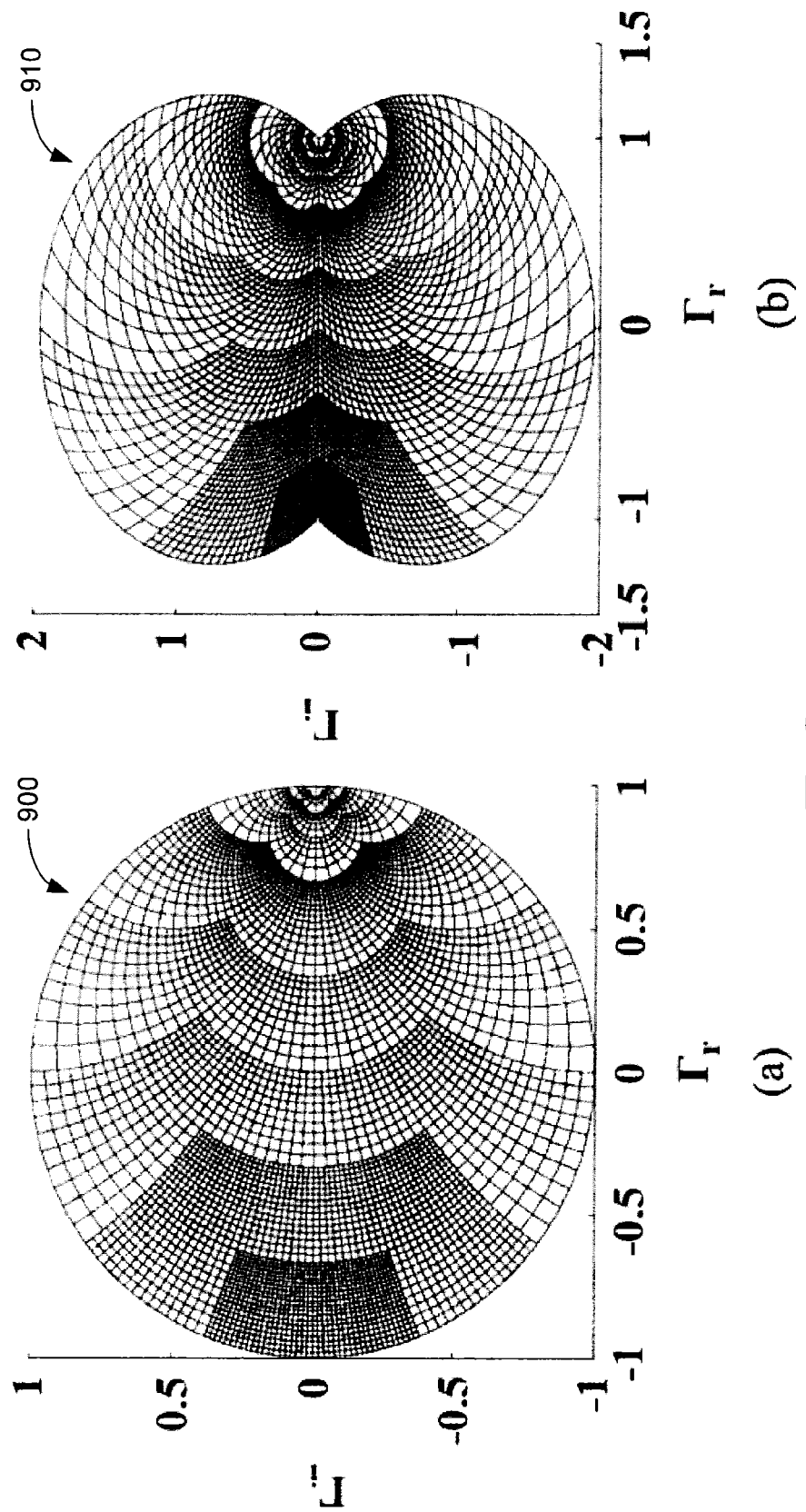
FIGS. 9(a) and 9(b) are examples of a traditional Smith chart and a fractional order Smith chart in accordance with various embodiments of the present disclosure.

With reference to FIGS. 9(*a*) and 9(*b*), shown are examples of a traditional Smith chart 900 and a fractional order Smith chart 910, respectively. For the non-fractional case $|\alpha|=1$, the traditional Smith chart 900 is achieved as shown in FIG. 9(*a*). As $|\alpha|$ increases, the center of the constant resistance circles moves up on the $\Gamma_i$ axis and vice versa. As the value of $|\alpha|$ moves from 1 to 2, the radii of the constant resistance circles also increase. For $|\alpha|$ values greater than 1 (e.g., $|\alpha|=1.4$), the fractional order Smith 910 is as shown in FIG. 9(*b*). The constant $|z_f|$ circles always pass through the $\Gamma_r=1$ and $\Gamma_i=0$ point as well, however the center of these circles stays at $\Gamma_r=1$. From EQN. (10) it can be seen that, as $|\alpha|$ moves away from the center ($|\alpha|=1$), the center of constant $|z_f|$ circles move towards ±∞ making them larger and vice versa. Unlike the traditional Smith 900, the electrical length, shown around the periphery of the fractional order Smith 910, is not equally spaced.

If a complex normalized impedance, e.g., $z=3-j1$ has to be plotted on a traditional Smith chart, it will be located at the intersection point $(3, -1)$. If the same complex impedance is plotted on a fractional order Smith chart ($|\alpha|\neq1$), it will employ different intersection points. The fractional order Smith chart coordinates may be found through two different methods as will be discussed.

Figure 4:
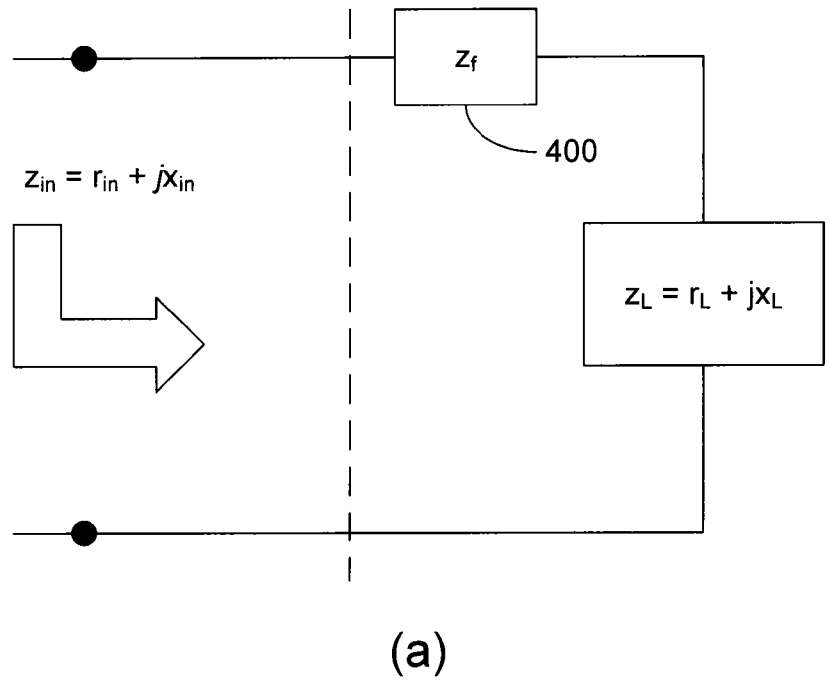
FIGS. 4(a) and 4(b) are schematic and graphical illustrations of fractional impedance matching of fractional orders of FIG. 2(b) in accordance with various embodiments of the present disclosure.
Figure 4:
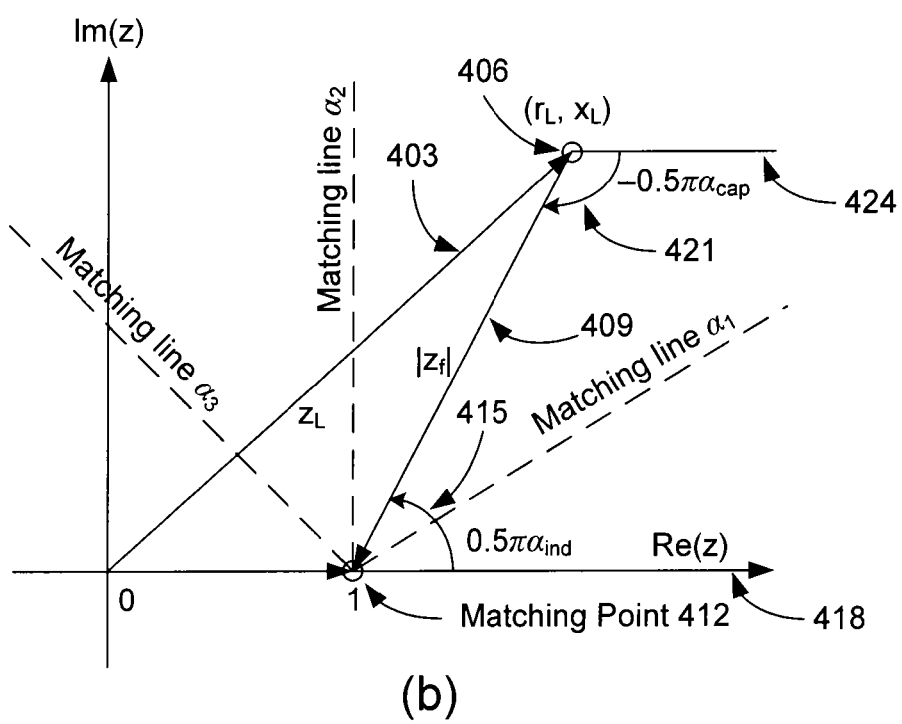
Figure 10:
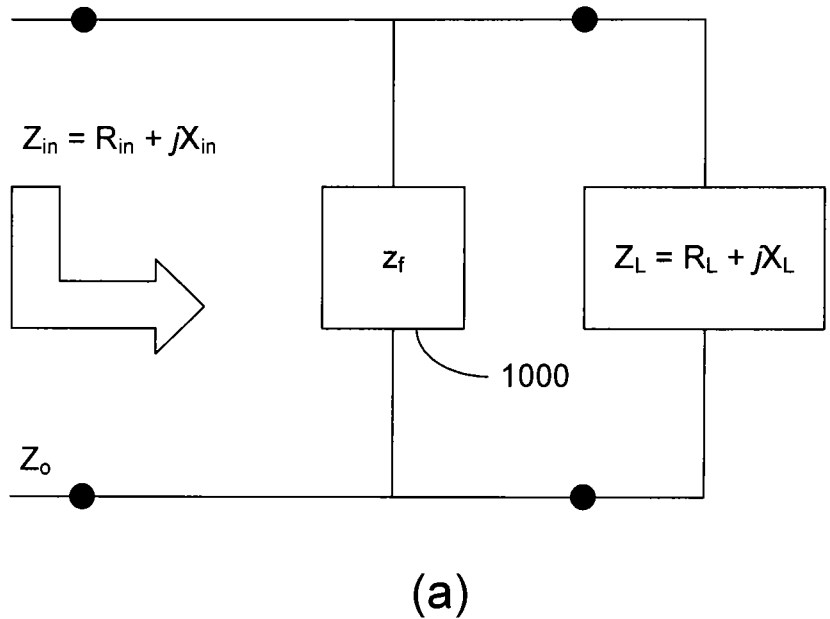
FIGS. 10(a) and 10(b) are schematic and graphical illustrations of fractional impedance matching of fractional orders of FIG. 2(b) and load impedance matching regions in accordance with various embodiments of the present disclosure.
Figure 10:
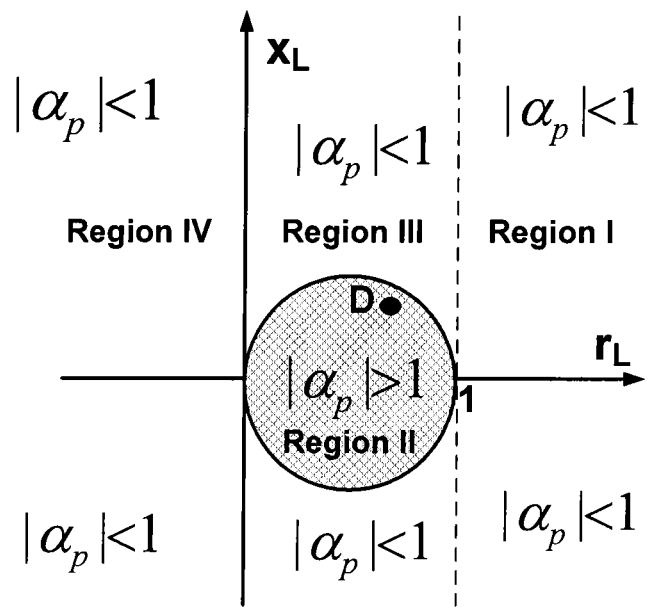
Figure 11:
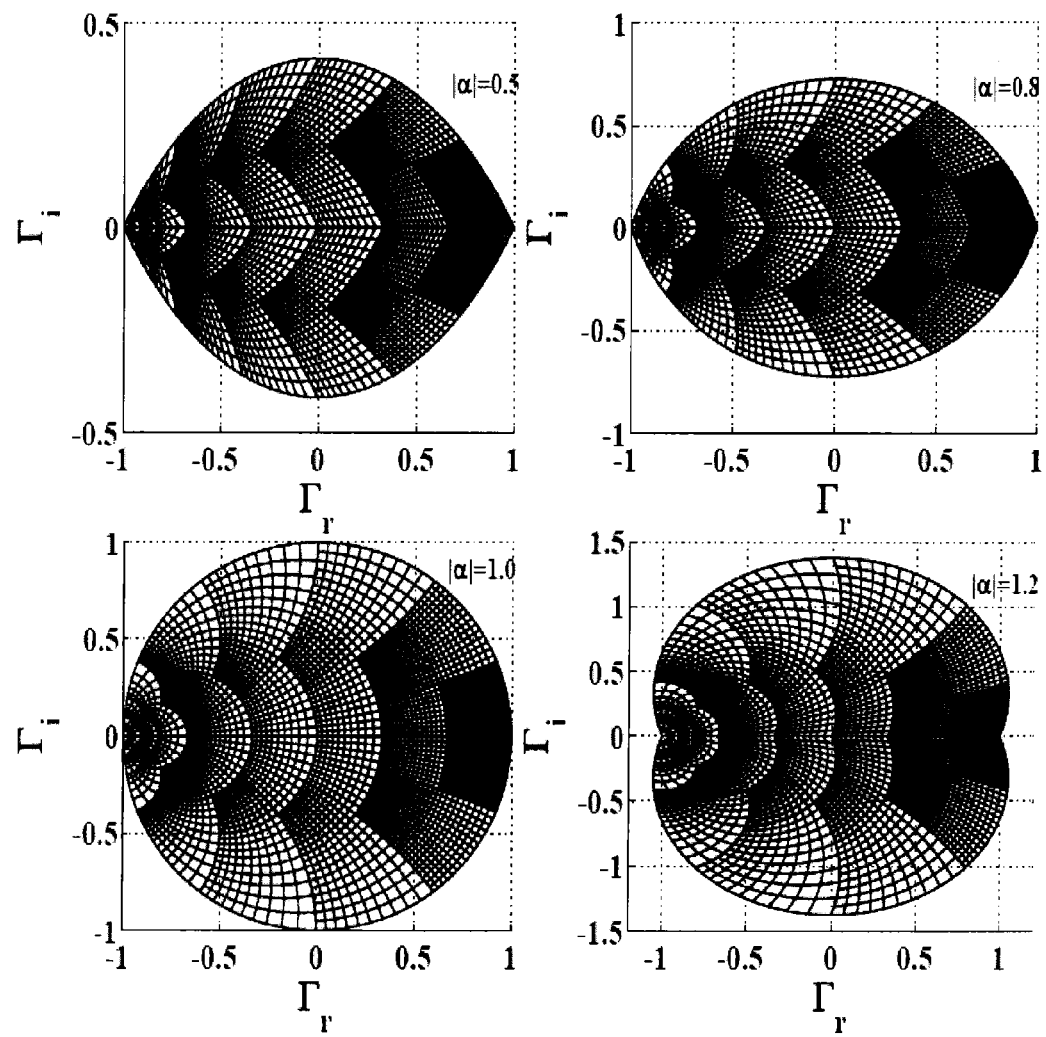
FIG. 11 is examples of a traditional Smith chart and fractional order Smith charts in accordance with various embodiments of the present disclosure.

Referring to FIG. 10(*a*), shown is a schematic illustration of fractional impedance matching with a parallel fractional element ($z_f$) 1000. It can be observed that a wider range of load impedances can be matched using a single parallel fractional order element 1000 with order less than one ($|\alpha|<1$) as compared to the series fractional element 400 (FIG. 4). This fact is elaborated in FIG. 10(*b*), where it is shown that a single parallel fractional element 1000 can match any complex impedance in all the four regions, including the negative resistance region IV that is important for microwave applications. It is worth mentioning here that a fractional element with order less than 1 can be realized as a passive element. However, for $|\alpha|>1$ implementations, active elements would be required. FIG. 11 shows examples of the generalized fractional order admittance Smith chart for different fractional orders $|\alpha|$ equal to 0.5, 0.8, 1.0 (conventional) and 1.2.

Figure 12:
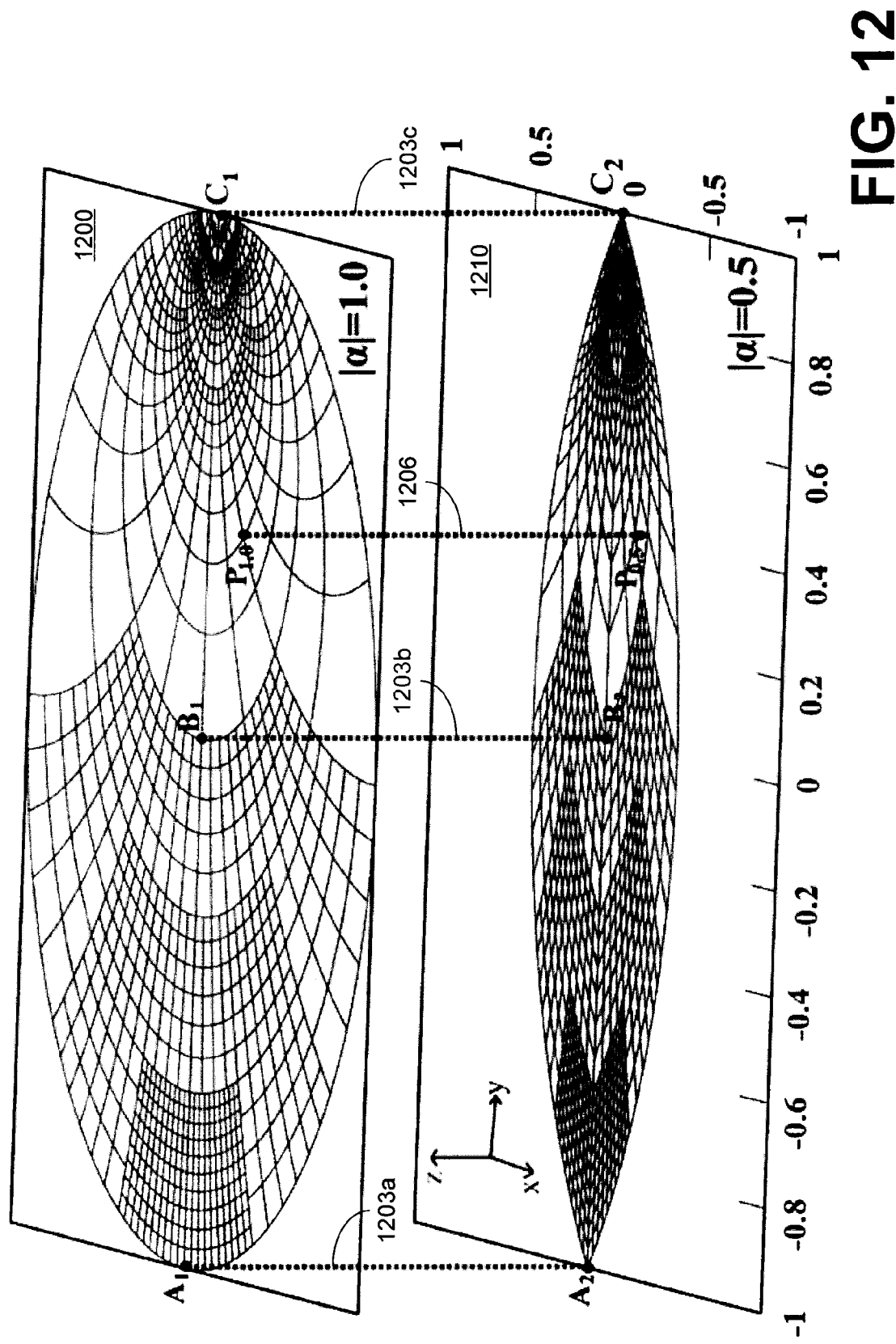
FIG. 12 illustrates a graphical method that may be used to determine the fractional element information in accordance with various embodiments of the present disclosure.

Referring to FIG. 12, a graphical method is illustrated that may be used to determine the fractional element information.

The impedance z=3−j1 is represented by coordinates Pα$_1$= (r$_1$, |z$_{f1}$|) and Pα$_2$=(r$_2$, |z$_{f2}$|) on |α$_1$| and |α$_2$| order Smith charts, respectively. The simplest graphical implementation is to work from the traditional Smith 1200 (|α$_1$|=1) towards the fractional order Smith 1210 (|α$_2$|≠1), say |α$_2$|=0.5 as illustrated in the example of FIG. 12. The fractional order Smith 1210 is placed below the traditional Smith 1200 in such a way that the pairs of points A$_1$-A$_2$ corresponding to the Γ$_r$=−1 and Γ$_i$=0, B$_1$-B$_2$ corresponding to the Γ$_r$=0 and Γ$_i$=0, and C$_1$-C$_2$ corresponding to the Γ$_r$=1 and Γ$_i$=0 overlap as illustrated by lines 1203a, 1203b, and 1203c, respectively.

Now the complex normalized impedance z is plotted on the traditional |α$_1$|=1 Smith 1200 at location P$_{1.0}$=(3, −1) coordinates in a standard fashion. The P$_{1.0}$ location is then projected as illustrated by line 1206 onto the lower fractional order |α$_2$|=0.5 Smith 1210. For example, a pinhole may be drilled through this point so that it marks the P$_{0.5}$=(2, −1.414) coordinates on the fractional order Smith 1210. The coordinates P$_{0.5}$ represent z=3−j1 on the fractional order Smith 1210, as will be confirmed by the second analytical method. This method of plotting is extremely useful for the problem where different fractional order elements are present and it is required to switch back and forth from one order Smith chart to the other. After plotting, the fractional order Smith chart can be used for functions like transformation from the reflection coefficient to impedance or admittance, or conversion from the load impedance to the input impedance in a normal fashion for a multi-order fractional system.

An analytical method may also be implemented using a computing device to determine the relationship between the Pα$_1$ and Pα$_2$ coordinates. The expressions for z$_{f1}$ and z$_{f2}$ represented by coordinates Pα$_1$=(r$_1$, |z$_{f1}$|) and Pα$_2$=(r$_2$, |z$_{f2}$|) on |α$_1$| and |α$_2$| order Smith charts, respectively, are given by EQN. (3). A relationship between Pα$_1$ and Pα$_2$, derived through equating the real and imaginary parts of these fractional impedances, is given by:

$$|z_{f2}| = |z_{f1}|\left(\frac{\sin(0.5\pi|\alpha_1|)}{\sin(0.5\pi|\alpha_2|)}\right) \quad \text{EQN. (11)}$$

$$r_2 = r_1 - |z_{f1}|\left(\frac{\sin(0.5\pi(|\alpha_1|-|\alpha_2|))}{\sin(0.5\pi|\alpha_2|)}\right) \quad \text{EQN. (12)}$$

The example of z=3−j1, that was plotted on a fractional order |α$_2$|=0.5, may also be resolved by evaluating EQNS. (11) and (12). As in the graphical method example of FIG. 12, first the coordinates for the traditional Smith chart, i.e. |α$_1$|=1, are found to be P$_{1.0}$=(3, −1). Since the values of |α$_1$|, r$_1$, and |z$_{f1}$| are known, the coordinates of the fractional order |α$_2$|=0.5 are found to be P$_{0.5}$=(2, −1.414). These are exactly the same coordinates obtained through the graphical method of FIG. 10 and hence prove the concept.

Figure 13:
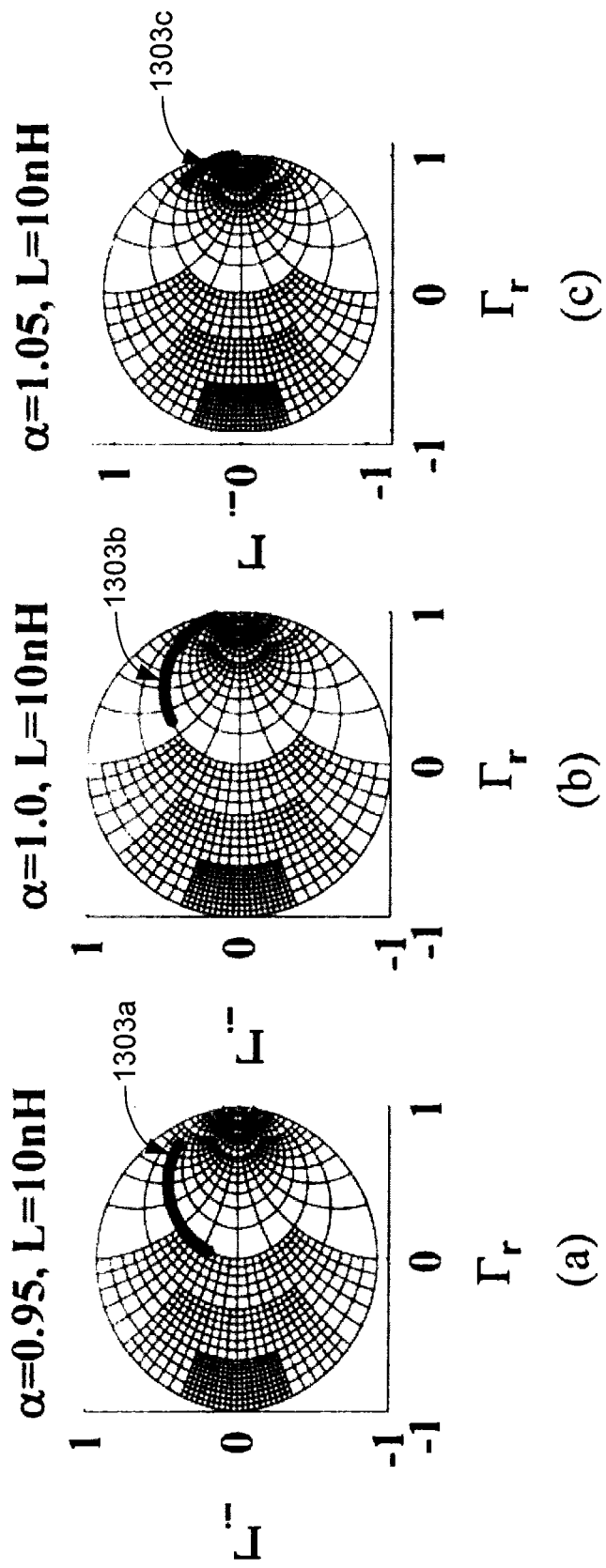
FIGS. 13(a), 13(b), and 13(c) are examples of fractional order Smith charts illustrating the effect of $\alpha$ on the response to changes in frequency in accordance with various embodiments of the present disclosure.

Referring now to FIGS. 13(a), 13(b), and 13(c), shown are examples of fractional order Smith charts illustrating the effect of α on the response to changes in frequency. As mentioned above, |Z$_f$|=ω$^{|\alpha|}$L and |Z$_f$|=1/(ω$^{|\alpha|}$C) for fractional order elements L and C, respectively. Consider, e.g., a load impedance comprising a resistance R$_L$=50Ω in series with an inductance L$_L$=10 nH (α>0), such that Z$_L$=R$_L$+(jω)$^\alpha$L$_L$. Since |Z$_f$| is dependent on ω and α in a nonlinear fashion, it can be seen in FIGS. 13(a), 13(b), and 13(c), that for different values of α (e.g., α=0.95, 1.0, and 1.05, respectively), the frequency response is different as illustrated by curves 1303a, 1303b, and 1303c. Two important observations can be made here, where the frequency range is from 1 to 10 GHz. First, as the value of α increases, the curves 1303 shift clockwise. Secondly, the length of the curves 1303 varies with the change of α. This property provides another dimension of control, where microwave designs can be made tunable and insensitive to frequency. This is clear from FIG. 13(c), where a marginal reduction in α has significantly reduced the frequency effect. An important conclusion in this regard is that with careful design parameter selection, very wide-band microwave designs are feasible.

Figure 14:
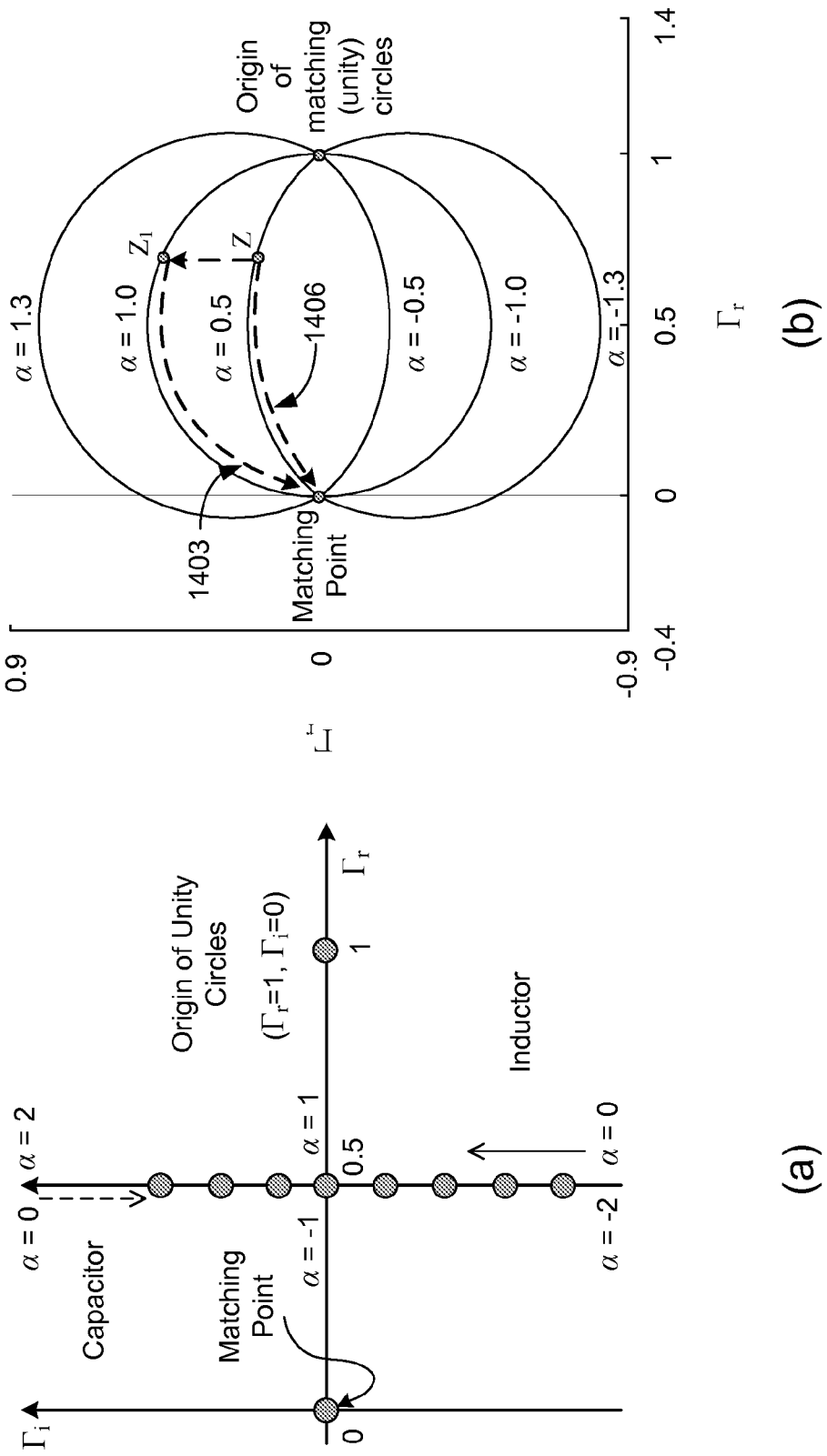
FIGS. 14(a) and 14(b) are plots illustrating impedance matching with fractional element in accordance with various embodiments of the present disclosure.

Referring next to FIGS. 14(a) and 14(b), shown are plots illustrating impedance matching with fractional elements. Traditionally, a matching network provides two degrees of freedom, first to match the real part precisely or move to the unity (r=1) circle and second to cancel out the reactive component or move on the unity circle to the center of the Smith chart. From EQN. (9), it can be seen that the equation for the matching (unity) circle in a fractional Smith chart is given by:

$$(\Gamma_r-0.5)^2+(\Gamma_i\pm 0.5\cot(0.5\pi|\alpha|))^2=(0.5csc(0.5\pi|\alpha|))^2 \quad \text{EQN. (13)}$$

It can be observed from EQN. (13), that varying |α| will vary the matching circles centres as shown in their loci in FIG. 14(a). These circles always pass through the Γ$_r$=0, Γ$_i$=0 and Γ$_r$=1, Γ$_i$=0 points. As |α| increases, the circle centers move up for inductors and down for capacitors. Any complex impedance will lie on one of these matching circles for which the corresponding |α| can be determined through EQN. (13). This means that for a fractional matching element, selection of |α| will provide the first degree of freedom. The imaginary part of the load impedance can then be cancelled out through the fractional element impedance magnitude |Z$_f$|, which ensures the load impedance transfer to the matching point as shown in the example of FIG. 14(b). For example, consider a normalized load impedance z. The traditional elements are matched by moving the load, first from point z to the |α|=1 matching circle point marked as and then from to the matching point along curve 1403, in contrast to one step matching for the fractional element (shown as curve 1406 along the fractional order matching circle). The trade-off is the loss due to the resistance of the fractional element. However, this resistance is dependent on the cosine function that can be optimized to minimize the loss.

Figure 15:
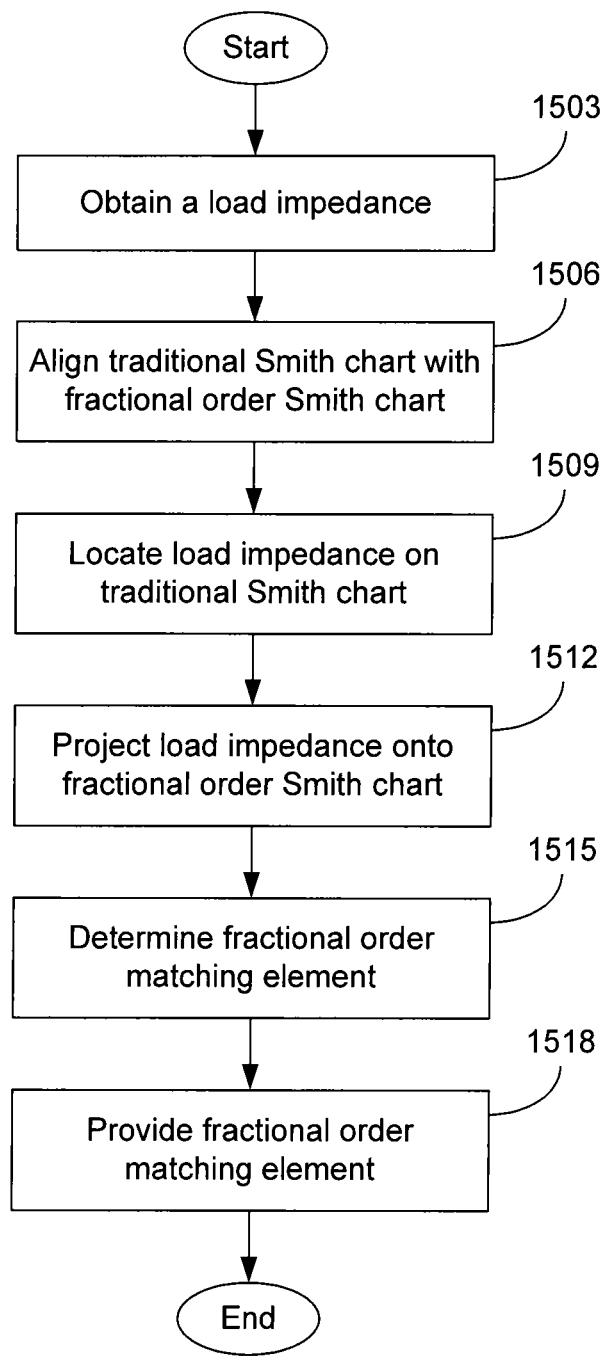
FIGS. 15 and 16 are flowcharts illustrating methods to determine fractional element information in accordance with various embodiments of the present disclosure.

Referring next to FIG. 15, shown is a flowchart illustrating the graphical method to determine fractional element information. Beginning with block 1503, the load impedance is obtained for a load that will be connected to a transmission line. The characteristic line impedance for the transmission line is also obtained. The load impedance may be normalized based upon the characteristic line impedance. In block 1506, a traditional Smith chart (|α|=1) with a fractional order Smith chart (|α|≠1) as illustrated in FIG. 12. The reflection coefficient points (Γ$_r$=−1, Γ$_i$=0), (Γ$_r$=0, Γ$_i$=0), and (Γ$_r$=1, Γ$_i$=0) of the traditional Smith chart are aligned with the reflection coefficient points (Γ$_r$=−1, Γ$_i$=0), (Γ$_r$=0, Γ$_i$=0), and (Γ$_r$=1, Γ$_i$=0) of the fractional order Smith chart.

The load impedance is located on the traditional Smith chart in block 1509. The load impedance is represented by coordinates Pα=(r, |z$_f$|) corresponding to the order |α|=1. In some implementations, the load impedance is plotted on the traditional Smith chart before aligning with the fractional order Smith chart. In block 1512, the load impedance is projected onto the fractional order Smith chart to determine the location on the fractional order Smith chart. A fractional order matching element is determined in block 1515 by transitioning from the projected location along a matching circle of the fractional order Smith chart. The fractional order matching element is based at least in part upon the characteristic line impedance for matching. In block 1518, the fractional order matching element may be provided for connection between the load corresponding to the load impedance and the transmission line.

Figure 16:
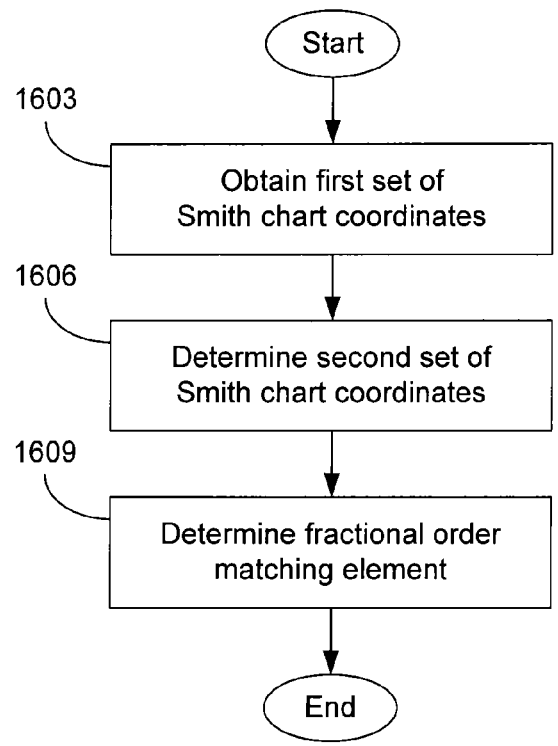

Referring next to FIG. 16, shown is a flowchart illustrating the analytical method to determine fractional element information. Beginning with block 1603, a first set of Smith chart coordinates ($P\alpha_1$) having a resistance (r) and a magnitude of impedance (|z|) at a first order ($\alpha_1$) is obtained. The coordinates $P\alpha 1$ correspond to a load impedance associated with a load to be attached to a transmission line. The first order $\alpha_1$ may be one ($|\alpha_1|=1$) as in the traditional Smith chart or may be a fractional order ($|\alpha_1|\neq 1$). In block 1606, a second set of Smith chart coordinates ($P\alpha_2$) is determined at a second order ($\alpha_2$) based at least in part upon the first set of Smith chart coordinates ($P\alpha_1$) and the first and second orders ($\alpha_1$ and $\alpha_2$). The second order is a fractional order ($|\alpha_2|\neq 1$). The relationship between the first and second set of Smith Chart coordinates $P\alpha_1$ and $P\alpha_2$ may be given by EQNS. (11) and (12).

A fractional order matching element may then be determined in block 1609 from the second set of Smith chart coordinates ($P\alpha_2$) based at least in part upon a characteristic line impedance of the transmission line. In some implementations, a fractional order element design may be provided based, e.g., on a lookup table or a rule based expert system.

In some embodiments, the load impedance may be obtained from an impedance measurement device configured to measure the impedance of the load. This may be, e.g., a measurement device that is configured to perform one or more test(s) and/or measurement(s) on a connected load to determine the impedance. The measurement device may be a separate device from which the impedance information is obtained by, e.g., a computing device or may be included as part of the computing device.

Figure 17:
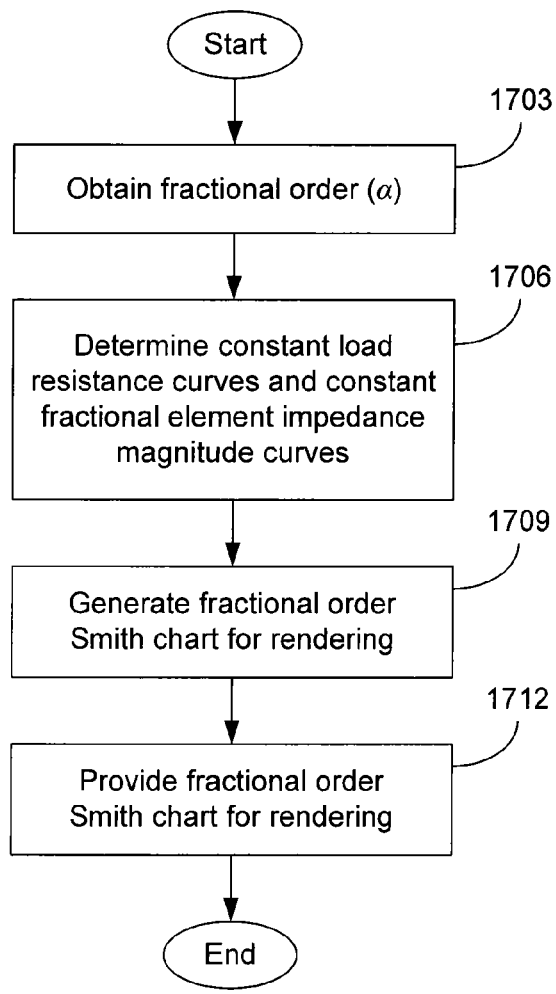
FIG. 17 is a flowchart illustrating generation of a fractional order Smith chart in accordance with various embodiments of the present disclosure.

Referring next to FIG. 17, shown is a flowchart illustrating the generation of a fractional order Smith chart. Beginning with block 1703, the fractional order ($\alpha$) of the fractional order Smith chart is obtained. The fractional order may be obtained, e.g., through a user interface, from a data table, or from another appropriate source. In block 1706, a plurality of constant load resistance curves and a plurality of constant fractional element impedance magnitude curves are determined based upon EQNS. (9) and (10) and the obtained fractional order. The fractional order Smith chart is then generated in block 1709 for rendering. The generated fractional order Smith chart may then be provided for rendering in block 1712. For example, the fractional order Smith chart may be provided for rendering on paper or may be provided for rendering on a display device. In some implementations, the generated fractional order Smith chart may be stored in memory for later rendering.

Figure 18:
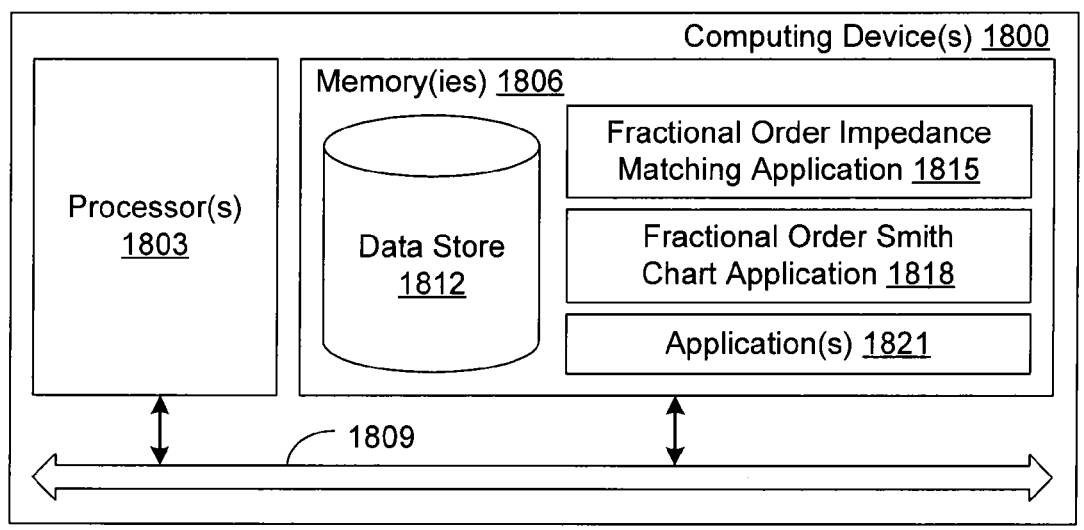
FIG. 18 is a schematic block diagram of a computing device according to various embodiments of the present disclosure.

With reference to FIG. 18, shown is a schematic block diagram of a computing device 1800 according to various embodiments of the present disclosure. The computing device 1800 includes at least one processor circuit, for example, having a processor 1803 and a memory 1806, both of which are coupled to a local interface 1809. To this end, the computing device 1800 may comprise, for example, at least one server computer or like device. The local interface 1809 may comprise, for example, a data bus with an accompanying address/control bus or other bus structure as can be appreciated.

Stored in the memory 1806 are both data and several components that are executable by the processor 1803. In particular, stored in the memory 1806 and executable by the processor 1803 are a fractional order impedance matching application 1815, a fractional order Smith chart application 1818, and/or other applications 1821. Also stored in the memory 1806 may be a data store 1812 and other data. In addition, an operating system may be stored in the memory 1806 and executable by the processor 1803.

It is understood that there may be other applications that are stored in the memory 1806 and are executable by the processor 1803 as can be appreciated. Where any component discussed herein is implemented in the form of software, any one of a number of programming languages may be employed such as, for example, C, C++, C#, Objective C, Java®, JavaScript®, Perl, PHP, Visual Basic®, Python®, Ruby, Delphi®, Flash®, or other programming languages.

A number of software components are stored in the memory 1806 and are executable by the processor 1803. In this respect, the term "executable" means a program file that is in a form that can ultimately be run by the processor 1803. Examples of executable programs may be, for example, a compiled program that can be translated into machine code in a format that can be loaded into a random access portion of the memory 1806 and run by the processor 1803, source code that may be expressed in proper format such as object code that is capable of being loaded into a random access portion of the memory 1806 and executed by the processor 1803, or source code that may be interpreted by another executable program to generate instructions in a random access portion of the memory 1806 to be executed by the processor 1803, etc. An executable program may be stored in any portion or component of the memory 1806 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

The memory 1806 is defined herein as including both volatile and nonvolatile memory and data storage components. Volatile components are those that do not retain data values upon loss of power. Nonvolatile components are those that retain data upon a loss of power. Thus, the memory 1806 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

Also, the processor 1803 may represent multiple processors 1803 and the memory 1806 may represent multiple memories 1806 that operate in parallel processing circuits, respectively. In such a case, the local interface 1809 may be an appropriate network that facilitates communication between any two of the multiple processors 1803, between any processor 1803 and any of the memories 1806, or between any two of the memories 1806, etc. The local interface 1809 may comprise additional systems designed to coordinate this communication, including, for example, performing load balancing. The processor 1803 may be of electrical or of some other available construction.

Although the fractional order impedance matching application 1815, the fractional order Smith chart application 1818, application(s) 1821, and other various systems described herein may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those skilled in the art and, consequently, are not described in detail herein.

Although the flowcharts of FIGS. 15-17 show a specific order of execution, it is understood that the order of execution may differ from that which is depicted. For example, the order of execution of two or more blocks may be scrambled relative to the order shown. Also, two or more blocks shown in succession in FIGS. 15-17 may be executed concurrently or with partial concurrence. Further, in some embodiments, one or more of the blocks shown in FIGS. 15-17 may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein, including the fractional order impedance matching application 1815, the fractional order Smith chart application 1818, and/or application(s) 1821, that comprises software or code can be embodied in any non-transitory computer-readable medium for use by or in connection with an instruction execution system such as, for example, a processor 1803 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system. The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, at least the following is claimed:

1. A method for fractional order element based impedance matching, comprising:
   aligning, by a computing device, a traditional Smith chart with a fractional order magnitude equal to one ($|\alpha|=1$) with a fractional order Smith chart with a fractional magnitude not equal to one ($|\alpha|\neq 1$);
   locating, by the computing device, a load impedance on the traditional Smith chart;
   projecting, by the computing device, the load impedance location from the traditional Smith chart onto the fractional order Smith chart; and
   determining, by the computing device, a fractional order matching element by transitioning along a matching circle of the fractional order Smith chart based at least in part upon a characteristic line impedance.

2. The method of claim 1, wherein reflection coefficient points ($\Gamma_r=-1, \Gamma_i=0$), ($\Gamma_r=0, \Gamma_i=0$), and ($\Gamma_r=1, \Gamma_i=0$) of the traditional Smith chart are aligned with reflection coefficient points ($\Gamma_r=-1, \Gamma_i=0$), ($\Gamma_r=0, \Gamma_i=0$), and ($\Gamma_r=1, \Gamma_i=0$) of the fractional order Smith chart, respectively where $\Gamma_r$ and $\Gamma_i$ are real and imaginary components, respectively, of the reflection coefficient points.

3. The method of claim 1, further comprising providing the fractional order matching element for connection between a load corresponding to the load impedance and a transmission line associated with the characteristic line impedance.

4. The method of claim 1, further comprising obtaining the load impedance and the characteristic line impedance.

5. The method of claim 4, further comprising normalizing the load impedance.

6. A system, comprising:
   at least one computing device; and
   a fractional order impedance matching application executed in the at least one computing device, the fractional order impedance matching application comprising:
   logic that obtains a first set of Smith chart coordinates ($P\alpha_1$) corresponding to a load impedance associated with a load, the Smith chart coordinates having a resistance (r) and a magnitude of impedance ($|z|$) at a first fractional order ($\alpha_1$);
   logic that determines a second set of Smith chart coordinates ($P\alpha_2$) at a second fractional order ($\alpha_2$) based upon the first set of Smith chart coordinates ($P\alpha_1$) and the first and second fractional orders ($\alpha_1$ and $\alpha_2$), where the second fractional order has a magnitude not equal to one ($|\alpha_2|\neq 1$); and logic that determines a fractional order matching element from the second set of Smith chart coordinates ($P\alpha_2$) based at least in part upon a characteristic line impedance.

7. The system of claim 6, wherein a magnitude of the first fractional order equals one ($|\alpha_1|=1$).

8. The system of claim 6, wherein the first fractional order has a magnitude not equal to one ($|\alpha_1|\neq 1$).

9. The system of claim 6, wherein the fractional order impedance matching application further comprises logic configured to determine the first set of Smith chart coordinates ($P\alpha_1$) from the load impedance.

10. The system of claim 9, further comprising an impedance measurement device in communication with the at least one computing device, wherein the at least one computing device is configured to obtain the load impedance from the impedance measurement device.

11. The system of claim 9, wherein the at least one computing device is configured to measure the load impedance.

12. The system of claim 6, wherein the second set of Smith chart coordinates $P\alpha_2=(r_2, |z_{f2}|)$ is related to the first set of Smith chart coordinates $P\alpha_1=(r_1, |z_{f1}|)$ as follows:

$$|z_{f2}| = |z_{f1}|\left(\frac{\sin(0.5\pi|\alpha_1|)}{\sin(0.5\pi|\alpha_2|)}\right);$$

and $$r_2 = r_1 - |z_{f1}|\left(\frac{\sin(0.5\pi(|\alpha_1| - |\alpha_2|))}{\sin(0.5\pi|\alpha_2|)}\right),$$

where $r_1$ and $r_2$ are resistances and $|z_{f1}|$ and $|z_{f2}|$ are of fractional impedance.

13. A printed fractional order Smith chart, comprising:
a plurality of constant load resistance curves defined by:

$$\left(\Gamma_r - \frac{r_L}{r_L+1}\right)^2 + \left(\Gamma_i \pm \frac{\cos(0.5\pi|\alpha|)}{(r_L+1)\sin(0.5\pi|\alpha|)}\right)^2 = \left(\frac{1}{(r_L+1)\sin(0.5\pi|\alpha|)}\right)^2,$$

where $r_L$ is a normalized load resistance, $\alpha$ is a fractional order, $|\alpha|$ is a magnitude of the fractional order and $\Gamma=\Gamma_r+j\Gamma_i$ is a voltage reflection coefficient, where $\Gamma_r$ and $\Gamma_i$ are real and imaginary components, respectively, and $j=\sqrt{-1}$; and
a plurality of constant fractional element impedance magnitude curves defined by:

$$(\Gamma_r - 1)^2 + \left(\Gamma_i \mp \frac{1}{|z_f|\sin(0.5\pi|\alpha|)}\right)^2 = \left(\frac{1}{|z_f|\sin(0.5\pi|\alpha|)}\right)^2,$$

where $z_f$ is a normalized fractional element impedance; and
where the fractional order ($\alpha$) is in the range from $-2$ to $2$ and the magnitude of the fractional order is not equal to one ($|\alpha|\neq 1$).

14. The printed fractional order Smith chart of claim 13, wherein constant fractional element impedance magnitude curves defined with $\Gamma_i>0$ correspond to inductive curves and constant fractional element impedance magnitude curves defined with $\Gamma_i<0$ correspond to capacitive curves.

15. The printed fractional order Smith chart of claim 13, further comprising a traditional Smith chart with a fractional order magnitude equal to one ($|\alpha|=1$), wherein the pairs of points of the printed fractional order Smith chart and the traditional Smith chart corresponding to ($\Gamma_r=-1$, $\Gamma_i=0$), ($\Gamma_r=0$, $\Gamma_i=0$), and ($\Gamma_r=V1$, $\Gamma_i=V0$) overlap.

16. A system for generating a fractional order Smith chart, comprising:
at least one computing device; and
a fractional order Smith chart application executed in the at least one computing device, the fractional order Smith chart application comprising:
logic that obtains a fractional order ($\alpha$) of the fractional order Smith chart, where the fractional order ($\alpha$) is in the range from $-2$ to $2$ and the magnitude of the fractional order is not equal to one ($|\alpha|\neq 1$);
logic that determines a plurality of constant load resistance curves and a plurality of constant fractional element impedance magnitude curves based upon the fractional order, where the plurality of constant load resistance curves are defined by:

$$\left(\Gamma_r - \frac{r_L}{r_L+1}\right)^2 + \left(\Gamma_i \pm \frac{\cos(0.5\pi|\alpha|)}{(r_L+1)\sin(0.5\pi|\alpha|)}\right)^2 = \left(\frac{1}{(r_L+1)\sin(0.5\pi|\alpha|)}\right)^2,$$

where $r_L$ is a normalized load resistance, $|\alpha|$ is a magnitude of the fractional order and $\Gamma=\delta_r+j\Gamma_i$ is a voltage reflection coefficient, where $\Gamma_r$ and $\Gamma_i$ are real and imaginary components, respectively, and $j=\sqrt{-1}$, and where the plurality of constant fractional element impedance magnitude curves are defined by:

$$(\Gamma_r - 1)^2 + \left(\Gamma_i \mp \frac{1}{|z_f|\sin(0.5\pi|\alpha|)}\right)^2 = \left(\frac{1}{|z_f|\sin(0.5\pi|\alpha|)}\right)^2,$$

where $z_f$ is a normalized fractional element impedance; and
logic that generates the fractional order Smith chart for rendering, the fractional order Smith chart comprising the plurality of constant load resistance curves and the plurality of constant fractional element impedance magnitude curves.

17. The system of claim 16, wherein the fractional order Smith chart is rendered on a sheet of paper.

18. The system of claim 16, wherein the fractional order Smith chart is rendered on a display device.

19. The system of claim 16, wherein the fractional order Smith chart is generated with an indication corresponding to a defined load impedance.

20. The system of claim 16, wherein the fractional order Smith chart is stored in memory.

* * * * *

UNITED STATES PATENT AND TRADEMARK OFFICE
CERTIFICATE OF CORRECTION

| | |
|---|---|
| PATENT NO. | : 8,762,114 B2 |
| APPLICATION NO. | : 13/288135 |
| DATED | : June 24, 2014 |
| INVENTOR(S) | : Ahmed Gomaa Ahmed Radwan, Atif Shamim and Khaled N. Salama |

It is certified that error appears in the above-identified patent and that said Letters Patent is hereby corrected as shown below:

On the title page item 75 Inventors: change the order of inventors from "Khaled N. Salama, Thuwal (SA); Ahmed Gomaa Ahmed Radwan, Thuwal (SA); Atif Shamim, Thuwal (SA)" to --Ahmed Gomaa Ahmed Radwan, Thuwal (SA); Atif Shamim, Thuwal (SA); Khaled N. Salama, Thuwal (SA)--.

Signed and Sealed this
Nineteenth Day of April, 2016

Michelle K. Lee
*Director of the United States Patent and Trademark Office*